United States Patent
Tu

(10) Patent No.: US 8,604,531 B2
(45) Date of Patent: Dec. 10, 2013

(54) METHOD AND APPARATUS FOR IMPROVING CAPACITOR CAPACITANCE AND COMPATIBILITY

(75) Inventor: Kuo-Chi Tu, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 285 days.

(21) Appl. No.: 12/905,523

(22) Filed: Oct. 15, 2010

(65) Prior Publication Data
US 2012/0091519 A1    Apr. 19, 2012

(51) Int. Cl.
*H01L 27/108* (2006.01)
*H01L 29/94* (2006.01)

(52) U.S. Cl.
USPC ........... 257/300; 438/239; 438/253; 257/303; 257/306; 257/E21.008

(58) Field of Classification Search
USPC .......................................... 438/239; 257/300
See application file for complete search history.

(56) References Cited

U.S. PATENT DOCUMENTS

| | | | |
|---|---|---|---|
| 6,423,608 B1 * | 7/2002 | Kim ............................. | 438/396 |
| 6,576,941 B1 * | 6/2003 | Lee et al. ....................... | 257/295 |
| 6,737,728 B1 | 5/2004 | Block et al. | |
| 6,781,185 B2 | 8/2004 | Chen et al. | |
| 6,803,641 B2 | 10/2004 | Papa Rao et al. | |
| 6,936,881 B2 | 8/2005 | Yeo et al. | |
| 6,937,457 B2 | 8/2005 | Shih et al. | |
| 6,940,705 B2 | 9/2005 | Yeo et al. | |
| 7,195,970 B2 | 3/2007 | Tu et al. | |
| 7,557,399 B2 | 7/2009 | Tu et al. | |
| 2001/0024868 A1 * | 9/2001 | Nagel et al. .................. | 438/496 |
| 2010/0224925 A1 | 9/2010 | Ching et al. | |

OTHER PUBLICATIONS

Definition og Engage (http://www.merriam-webster.com/dictionary/engage; Webster-Merriam 20120.*

* cited by examiner

*Primary Examiner* — Michelle Mandala
*Assistant Examiner* — Shaka White
(74) *Attorney, Agent, or Firm* — Haynes and Boone, LLP

(57) ABSTRACT

A semiconductor device includes a semiconductor substrate, an isolation structure disposed in the semiconductor substrate, a conductive layer disposed over the isolation structure, a capacitor disposed over the isolation structure, the capacitor including a top electrode, a bottom electrode, and a dielectric disposed between the top electrode and the bottom electrode, and a first contact electrically coupling the conductive layer and the bottom electrode, the bottom electrode substantially engaging the first contact on at least two faces.

19 Claims, 14 Drawing Sheets

METHOD AND APPARATUS FOR IMPROVING CAPACITOR CAPACITANCE AND COMPATIBILITY

BACKGROUND

The present disclosure is related generally to the fabrication of semiconductor devices, and, more particularly, to a metal-insulator-metal (MIM) structure, a method of manufacturing the structure, and a semiconductor device incorporating the structure.

Capacitors are critical components for many data manipulation and data storage applications. In general, capacitors include two conductive electrodes on opposing sides of a dielectric or other insulating layer, and they may be categorized based on the materials employed to form the electrodes. For example, in a metal-insulator-metal (MIM) capacitor, the electrodes are substantially metal. MIM capacitors offer the advantage of a relatively constant value of capacitance over a relatively wide range of voltages applied thereto. MIM capacitors also exhibit a relatively small parasitic resistance.

Generally, it is desirable to maximize capacitance values of MIM capacitors. In this regard, capacitance values for a single capacitor generally increase as the surface area of the capacitor electrodes increases. However, when multiple MIM capacitors are utilized across multiple applications on a single semiconductor substrate, it is difficult to both maximize capacitance and fabricate the capacitors in a compatible manner. For example, MIM capacitors may be employed for both data retention in dynamic random access memory (DRAM) applications and decoupling in mixed-signal and microprocessor applications. In such a situation, chip designers strive to strike a balance between maximizing capacitance in each application and minimizing the number of process steps required to simultaneously fabricate the capacitors. Although multiple-application MIM capacitor designs have been generally satisfactory, they have not been satisfactory in all respects.

SUMMARY

According to one of the broader forms of the invention, a semiconductor device includes a semiconductor substrate, an isolation structure disposed in the semiconductor substrate, a conductive layer disposed over the isolation structure, a capacitor disposed over the isolation structure, the capacitor including a top electrode, a bottom electrode, and a dielectric disposed between the top electrode and the bottom electrode, and a first contact electrically coupling the conductive layer and the bottom electrode, the bottom electrode substantially engaging the first contact on at least two faces.

According to another of the broader forms of the invention, semiconductor device includes a semiconductor substrate including a first region and a second region, an isolation structure formed in the first region, a dummy gate electrode disposed over the isolation structure, a first metal-insulator-metal (MIM) capacitor formed over the isolation structure in the first region, the first MIM capacitor including a first top electrode, a first bottom electrode, and a first dielectric disposed therebetween, a first contact electrically coupling the dummy gate electrode and the first bottom electrode, the first bottom electrode engaging the first contact on at least two faces, and a second MIM capacitor formed over the second region, the second MIM capacitor including a second top electrode, a second bottom electrode, and a second dielectric disposed therebetween, the second MIM capacitor being compositionally equivalent to the first MIM capacitor.

According to yet another of the broader forms of the invention, a method of fabricating a semiconductor device that includes a semiconductor substrate including a first region and a second region, the first region including an isolation structure and a dummy gate electrode disposed over the isolation structure, the second region including a doped region and a gate electrode, the method includes forming a silicide layer on the dummy gate electrode and doped region, forming a first interlayer dielectric (ILD) layer over the dummy gate electrode in the first region and over the gate electrode and doped region in the second region, forming first and second contacts within the first ILD layer, the first and second contacts respectively engaging the silicide layer on the dummy gate electrode and the doped feature, forming an etch stop layer over the first ILD layer, forming a second ILD layer over the first ILD layer, extending the first contact through the second ILD layer, forming a first trench in the second ILD layer to expose the first contact on at least two faces, wherein the forming the first trench includes removing a portion of the second ILD layer and a portion of the etch stop layer, forming a second trench in the second ILD layer to expose a top portion of the second contact, wherein forming the second trench includes removing a portion of the second ILD layer and a portion of the etch stop layer, depositing a first metal layer to partially fill the first and second trenches, the first metal layer engaging the exposed faces of the first contact and the exposed portion of the second contact, depositing a dielectric material over the first metal layer in the first and second trenches, and depositing a second metal layer over the dielectric material in the first and second trenches.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
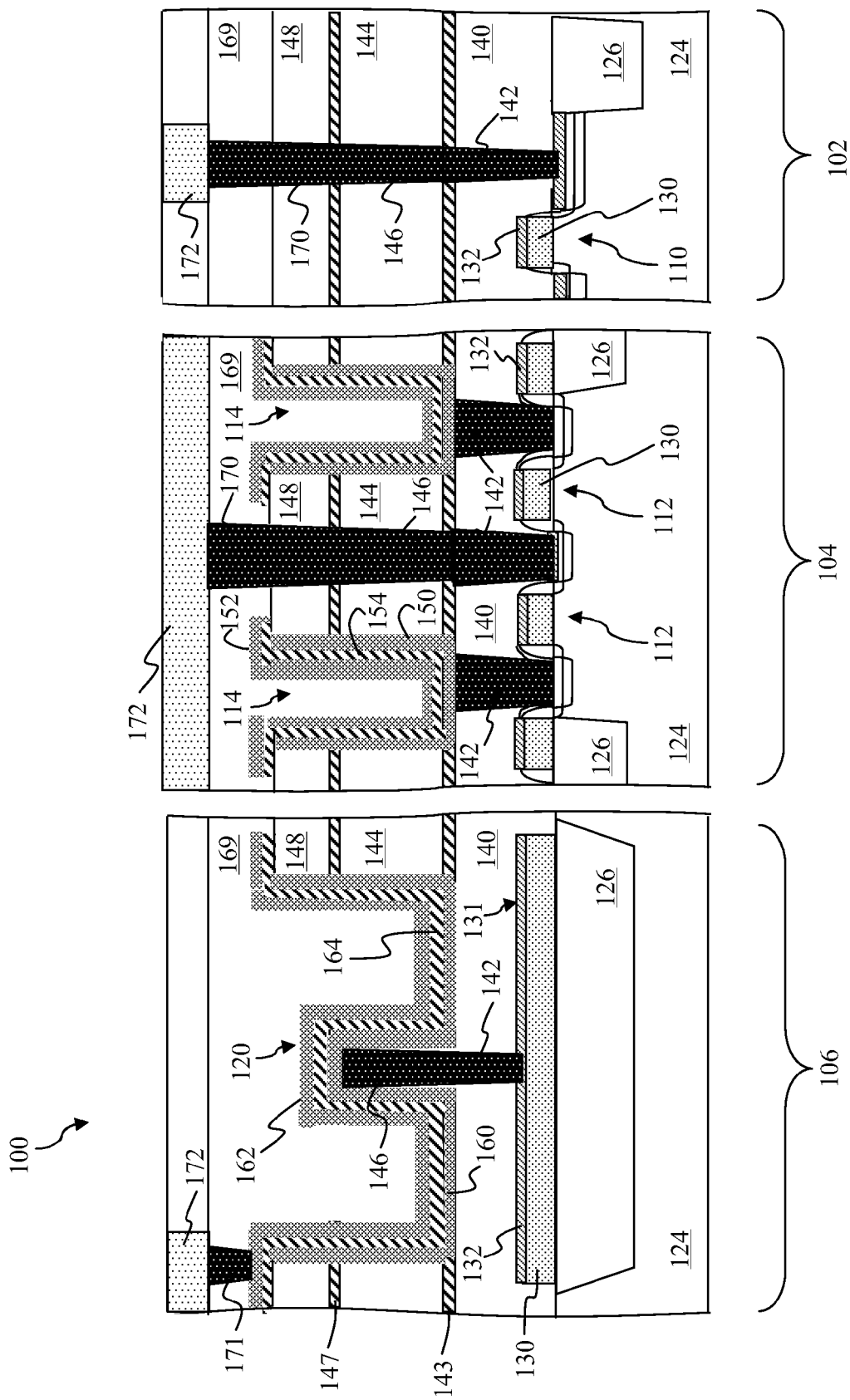
FIG. 1 is a diagrammatic sectional side view of a semiconductor device.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed between the first and second features, such that the first and second features may not be in direct contact.

FIG. 1 is a diagrammatic sectional side view of a semiconductor device 100. The semiconductor device 100 is configured as a system-on-chip (SoC) device that integrates various functions on a single chip. In the present embodiment, the semiconductor device 100 includes regions 102, 104, 106 that are each configured for a different function. The region 102 may include a transistor 110, such as a metal oxide semiconductor field effect transistor (MOSFET) or a complementary MOS (CMOS) transistor. In the current embodiment, the transistor 110 forms part of a logic circuit, but in other embodiment is may be part of a static random access memory (SRAM) circuit, processor circuit, or other suitable circuit. A region 104 may include a plurality of transistors 112 and capacitors 114 that, in the current embodiment, form a dynamic random access memory (DRAM) array for memory storage. A region 106 includes a metal-insulator-metal (MIM) capacitor 120. In the current embodiment, the MIM capacitor 120 is a decoupling capacitor but it other embodiments it may be used for various functions such as high-frequency noise filtering in mixed-signal applications. It may also be used in memory applications, oscillators, phase-shift networks, bypass filters, and as a coupling capacitor in radio frequency (RF) applications. It is understood that the semiconductor device 100 may include other features and structures such as eFuses, inductors, passivation layers, bonding pads, and packaging, but is simplified in FIG. 1 for the sake of simplicity and clarity.

The semiconductor device 100 includes a semiconductor substrate 124. In the present embodiment, the substrate 124 includes a silicon substrate (e.g., wafer) in a crystalline structure. The substrate 124 may include various doping configurations depending on design requirements as is known in the art (e.g., p-type substrate or n-type substrate). Additionally, the substrate 124 may include various doped regions such as p-type wells (p-wells or PW) or n-type wells (n-wells or NW). The substrate 124 may also include other elementary semiconductors such as germanium and diamond. Alternatively, the substrate 124 may include a compound semiconductor such as silicon carbide, gallium arsenide, indium arsenide, or indium phosphide. Further, the substrate 124 may optionally include an epitaxial layer (epi-layer), may be strained for performance enhancement, and may include a silicon-on-insulator (SOI) structure.

The semiconductor device 100 further includes isolation structures such as shallow trench isolation (STI) features 126 formed in the substrate 124 to isolate one or more devices. The STI features 126 may include silicon oxide, silicon nitride, silicon oxynitride, fluoride-doped silicate (FSG), and/or a low-k dielectric material known in the art. Other isolation methods and/or features are possible in lieu of or in addition to STI. The STI features 126 may be formed by reactive ion etching (RIE) the substrate 124 to form trenches, which are then filled with an insulator material by a deposition process and leveled with a chemical-mechanical-polishing (CMP) process.

In each regions 102, 104, and 106, a conductive material overlays the semiconductor substrate 124. In the current embodiment, the conductive material is a polysilicon layer 130. An oxide layer (e.g. gate dielectric) may be disposed between the polysilicon layer 130 and the substrate 124. The polysilicon layer 130 has been patterned into gate electrodes for the transistors 110 and 112 in the regions 102 and 104, respectively. Alternatively, the polysilicon layer 130 may be replaced with a multi-layer high-k metal gate (HKMG) stack, which may include a high-k dielectric, work function layer, capping layer, and conductive metal. Spacers, lightly doped drain (LDD) regions, and heavy doped source/drain regions may be formed adjacent the patterned gate electrodes in regions 102 and 104.

In the region 106, the polysilicon layer 130 has been patterned into a dummy gate electrode 131. The dummy gate electrode 131 is disposed over the STI region 126, and is thus electrically isolated from the substrate 124. A self-aligned silicide layer 132 overlays the polysilicon layer 130 and the source and drain regions of the transistors 110 and 114. Further, an inter-level (or inter-layer) dielectric (ILD) layer 140 covers the aforementioned features in the regions 102, 104, and 106. The ILD layer 140 may be formed of silicon oxide or a low-k dielectric material. A plurality of contacts 142 extend through the ILD layer 140 and engage the silicide layer 132. Specifically, the contacts 142 engage the source/drain features in regions 102 and 104 and engage the dummy gate electrode 131 in region 106. The contacts 142 made be composed of tungsten or other suitable conductive material. In the current embodiment, the contacts 142 have a circular-shaped cross-section, however, they may alternatively have any suitably-shaped cross-section such as a square or rectangular-shaped cross-section.

An etch stop layer 143 overlays the ILD layer 140 and may be formed of silicon nitride, silicon oxynitride, and/or other suitable materials. A further ILD layer 144 overlays the etch stop layer 143. Contacts 146 extend through the ILD layer 144 and through the etch stop layer 143 and are electrically coupled to the contacts 142 in the ILD layer 140. Although each contact 142 is labeled separately from its associated contact 146, each pair may be considered one integrated contact. The contacts 146 may be composed of tungsten or other suitable conductive material. In the current embodiment, the contacts 146 have a circular-shaped cross-section, however, they may alternatively have any suitably-shaped cross-section such as a square or rectangular-shaped cross-section. A further etch stop layer 147 overlays the ILD layer 144 and may be similar to etch stop layer 143. A third ILD layer 148 is disposed over the etch stop layer 147. The ILD layer 148 may be formed of a similar material as the ILD layers 144 and 140.

The MIM capacitors 114 in the region 104 include a bottom electrode 150, a top electrode 152, and an insulator 154 disposed between the top and bottom electrodes. In the current embodiment, the electrodes 150 and 152 are composed of titanium nitride (TiN). Alternatively, the electrodes 150 and 152 may optionally include may tantalum nitride (TaN), tungsten nitride (WN), ruthenium (Ru), iridium (Ir), platinum (Pt), and combinations thereof. Additionally, the electrodes 150 and 152 may include a stack of two or more layers, such as a titanium nitride/titanium or titanium nitride/tungsten. Although not limited by the present disclosure, the electrodes 150 and 152 may have a thickness ranging from about 100 to about 500 angstrom (Å). The insulator 154 is a high-k dielectric material such as zirconium oxide ($ZrO_2$). Alternatively, the insulator 154 may optionally include one or more layers of silicon oxide ($SiO_2$), silicon nitride ($Si_3N_4$), silicon oxynitride (SiON), aluminum oxide ($Al_2O_3$), hafnium silicates (HfSiON), tantalum oxide ($Ta_2O_5$), hafnium oxide ($HfO_2$), titanium oxide ($TiO_2$), barium strontium titanate (BST), strontium titanate oxide (STO), or combinations thereof. The insulator 154 may have a thickness ranging between about 50 to about 400 Å, but may alternatively be thicker or thinner. The MIM capacitors 114 extend downwardly through the ILD layers 148 and 144 and etch stop layers 147 and 143 such that the bottom electrodes 150 are respectively coupled to the doped features of the transistors 112 via the contacts 142.

The MIM capacitor 120 in the region 106 includes a bottom electrode 160, a top electrode 162, and an insulator 164. The bottom electrode 160, top electrode 162, and insulator 164 are composed of the same materials as the bottom electrode 150, top electrode 152, and insulator 154, respectively. The capacitor 120 extends downwardly through the ILD layers 148 and 144 and etch stop layer 147, and terminates at etch stop layer 143. The capacitor 120 wraps around the contact 146 in the region 106 such that the bottom electrode 160 engages the contact 146 on at least two faces. As shown in FIG. 1, the bottom electrode engages not only a top face of the contact 146, but also a substantial portion of the side faces of contact 146. The bottom electrode 160 is thus electrically coupled to the dummy gate electrode 131 via contact 146 and 142.

Although only one contact pair 142/146 is depicted in region 106, it is understood that a plurality of similar contacts may electrically couple the dummy gate electrode 131 to the bottom electrode 160 of the capacitor 120. In such a case, the capacitor 120 would similarly wrap around each of the plurality of contacts with the bottom electrode 160 engaging at least two faces of each of the plurality of contacts. Increasing the number of such contact pairs would increase the surface area of the bottom electrode 150, thereby increasing the capacitance of capacitor 120.

The semiconductor device further includes an ILD layer 169 formed over the capacitors 114, 120 in the regions 104, 106, respectively, and over the ILD layer 148. The ILD layer 169 is of similar composition as the ILD layer 148. In the regions 102 and 104, contacts 170 extend through the ILD layers 169 and 148 and engage the contacts 146. The contacts 170 may be of similar composition as the contacts 146 and 142. A contact 171 extends through ILD layer 169 in region 106 and engages the top electrode 162 of the capacitor 120. The semiconductor device 100 further includes a first metal layer 172 of a not-illustrated interconnect structure. Contact 171 electrically couples the top electrode 162 of the capacitor 162 to the metal layer 172, and thus the interconnect structure. Contact groups 170, 146, and 142 electrically couple the source/drain features of the transistors 110 and 112 in regions 102 and 104, respectively, to the metal layer 172. The interconnect structure may include a plurality of metal layers for interconnecting the various devices and features in the regions 102, 104, 106 as is known in the art. It is understood that the present disclosure does not limit the specific interconnection of the logic devices to each other or to a capacitor device or to the DRAM array. Those skilled in the art will recognize that there are myriad applications, structures, device layouts and interconnection schemes in which an embodiment of a capacitor device of the present disclosure may be implemented. Accordingly, for the sake of simplicity and clarity, additional details of the logic devices, DRAM array, and the interconnection between and among the various devices are not illustrated or further described herein.

With reference now to FIGS. 2-8, a method to manufacture the semiconductor device 100 of FIG. 1 is described. FIGS. 2-8 are diagrammatic sectional side views of a portion of the semiconductor device 100 during various successive stages of manufacture.

Figure 2:
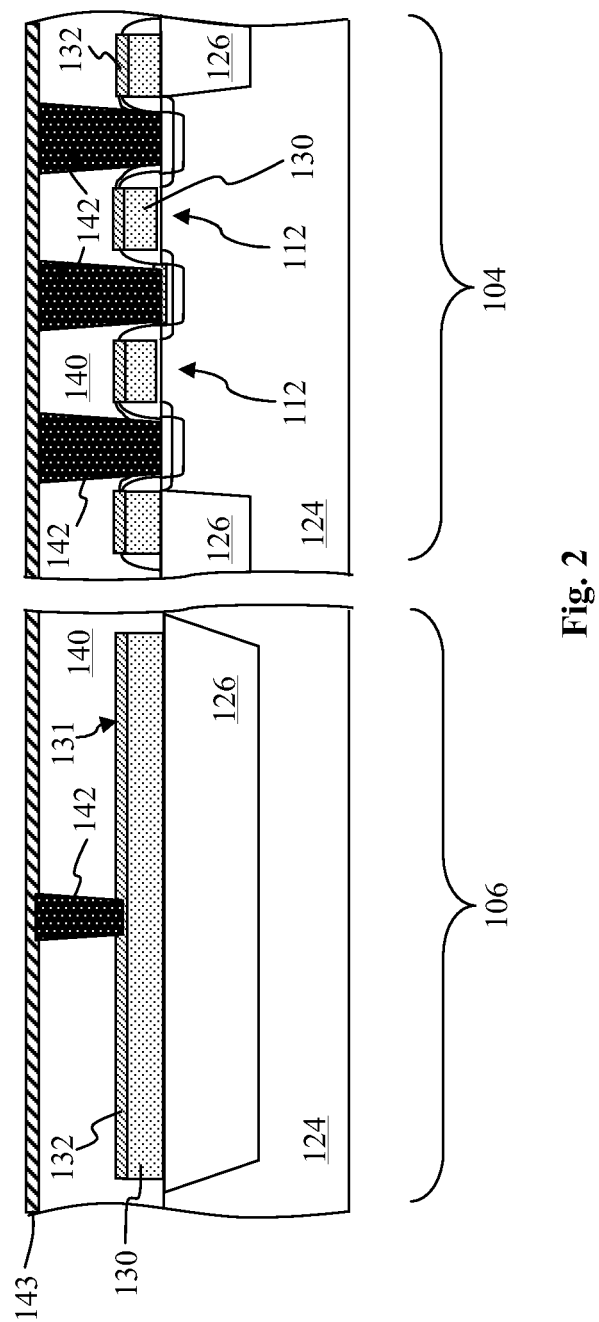
FIGS. 2-8 are diagrammatic sectional side views of a portion of the semiconductor device of FIG. 1 during various successive stages of manufacture.

FIG. 2 depicts a stage of manufacture in which the semiconductor device 100 is partially formed on the semiconductor substrate 124. In particular, features disposed below etch stop layer 143 have been formed, including dummy gate electrode 131 and contacts 142 in ILD layer 140.

Figure 3:
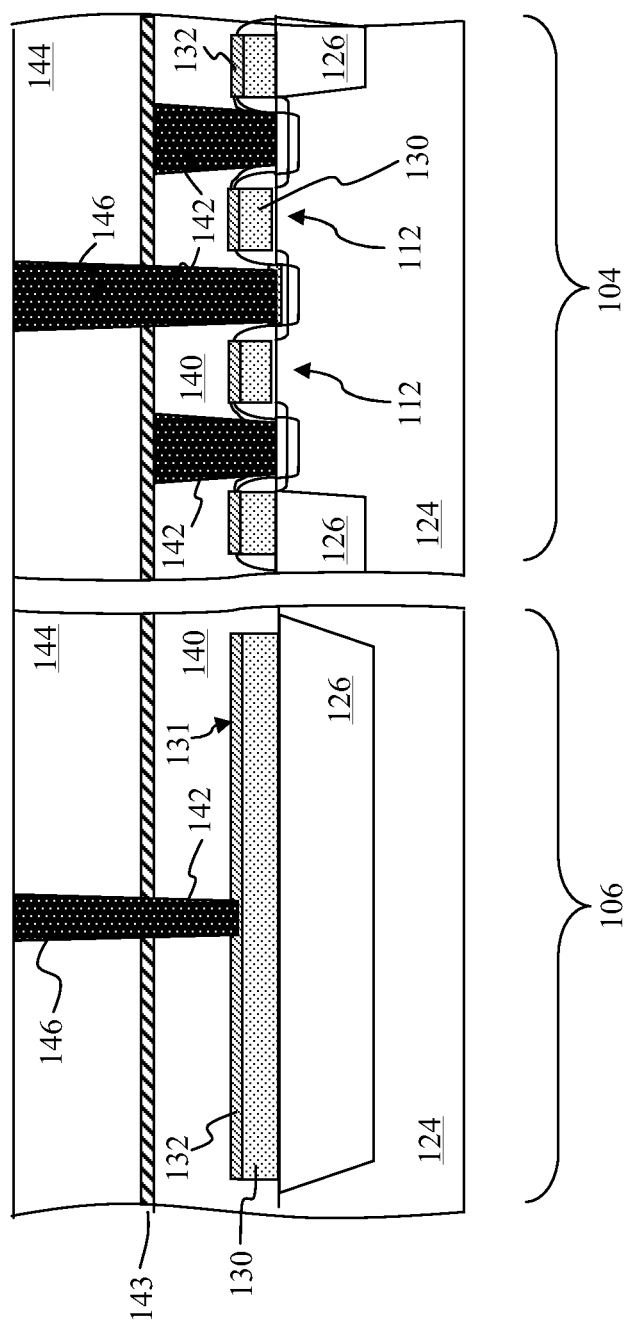

Referring to FIG. 3, the ILD layer 144 is deposited over the etch stop layer 143. The ILD layer 144 may be formed of silicon oxide or a low-k dielectric material by chemical vapor deposition (CVD), high density plasma CVD, spin-on, PVD (or sputtering), or other suitable methods. Next, the contacts 146 are formed in the ILD layer 144. In particular, the contacts 146 are formed by etching trenches in the ILD layer 144 and removing a portion of the etch stop layer 143, to expose a top portion of the contacts 142. The trenches are then filled with seed layers, barrier layers, and/or metal layers, followed by a planarization process, such as chemical-mechanical-polishing (CMP) or a etch-back process. The deposited metal engages the metal of the contacts 142 and after deposition, the contacts 146 are electrically coupled to the contacts 142.

Figure 4:
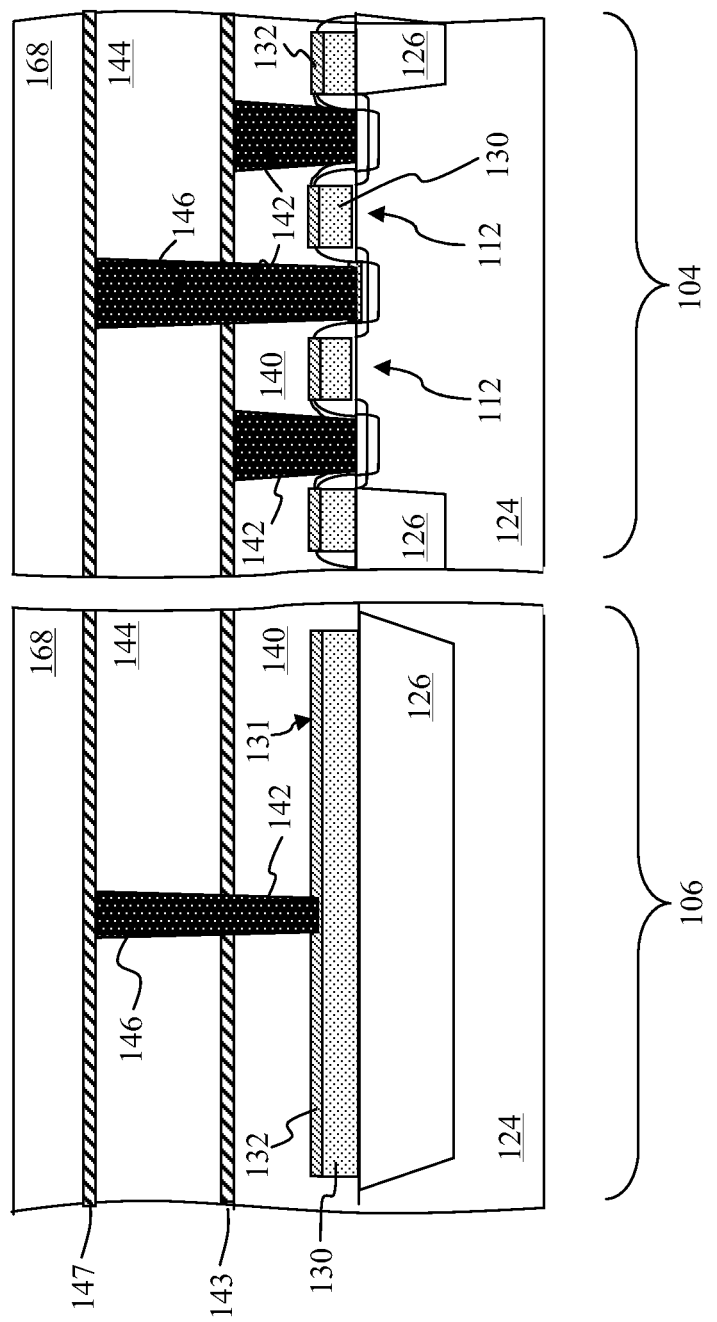

Referring now to FIG. 4, the etch stop layer 147 is formed over the ILD layer 144. Although not limited by the present disclosure, the etch stop layer 147 may comprise silicon carbide, silicon nitride, or silicon oxynitride, may be formed by CVD, plasma enhanced chemical vapor deposition (PECVD), or low pressure chemical vapor deposition (LPCVD). The etch stop layer 147 may have a thickness ranging from about 500 to about 1500 Å, but in other embodiments may thicker or thinner. For example, in an embodiment in which the etch stop layer comprises silicon carbide, the etch stop layer 147 may be formed by PECVD employing a process chemistry comprising trimethylsilane. The third ILD layer 168 is then deposited over the etch stop layer 147.

Figure 5:
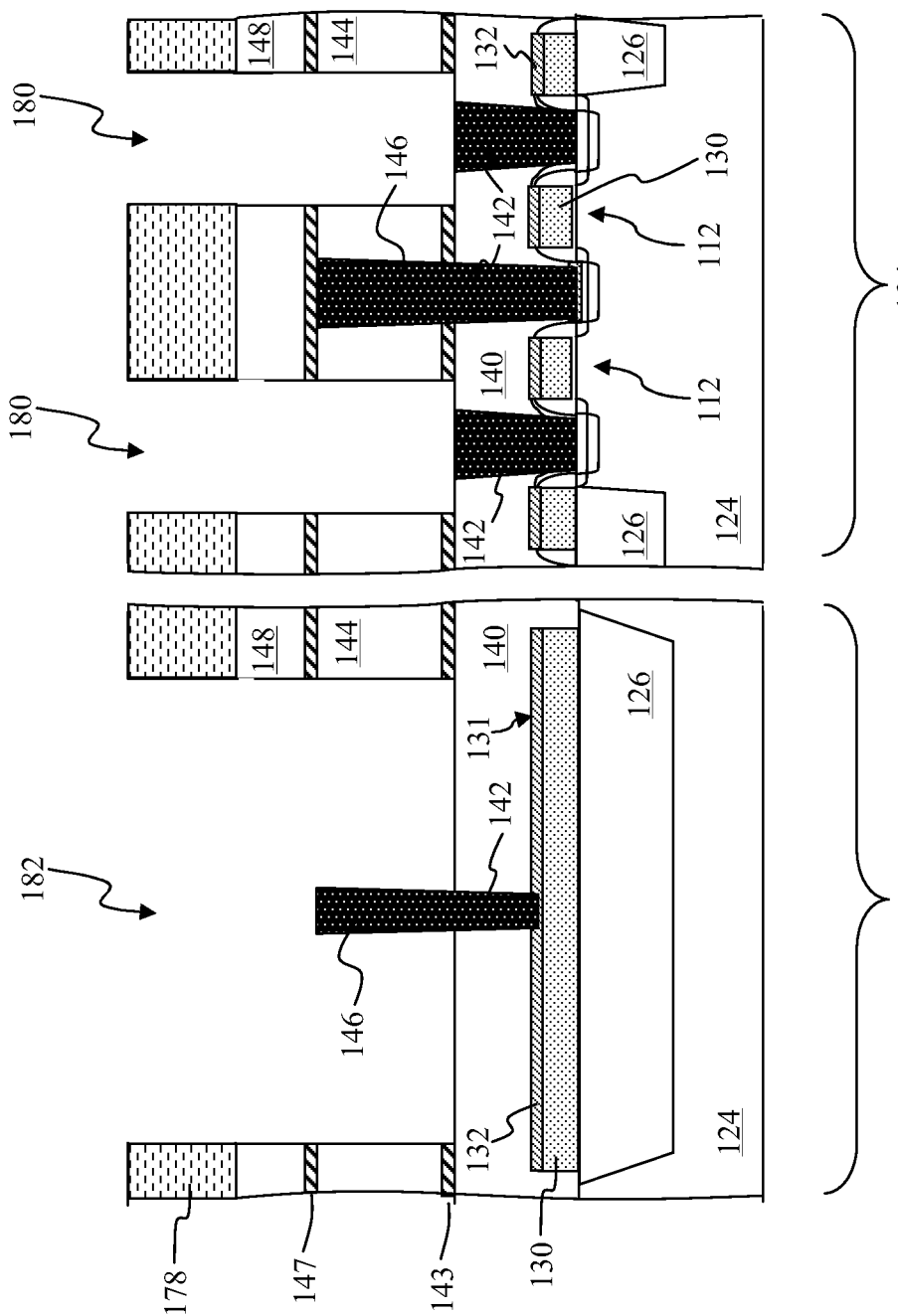

With reference to FIG. 5, a photoresist layer 178 is next deposited over the ILD layer 148 and patterned by a masking process to protect portions of the ILD layer 148. The photolithography patterning process may include any number of suitable steps including photoresist coating (e.g., spin-on coating), soft baking, mask aligning, exposure, post-exposure baking, developing the photoresist, rinsing, drying (e.g., hard baking), other suitable processes, and/or combinations thereof. Further, the photolithography exposing process may be wholly replaced by other proper methods, such as maskless photolithography, electron-beam writing, or ion-beam writing. After the photoresist has been patterned, multiple removal processes are employed to form trenches 180 in region 104 and a trench 182 in region 106. The trenches 180 and 182 extend downwardly through ILD layer 148, etch stop layer 147, ILD layer 144, and etch stop layer 143. After the removal processes are completed the contact 146 in the region 106 is exposed on at least two faces. And the top faces of the contacts 142 in the region 104 are exposed. The removal processes include etching processes to remove the ILD layers and other suitable processes to remove the etch stop layers. The etching process include dry etching, wet etching, and/or other etching methods. The trenches 180 and 182 may have vertical sidewalls and substantially square corners due to the anisotropic dry etch process. Alternatively, the corner profile of the trenches 180 and 182 may be rounded and smoothed by an isotropic wet etch process (e.g., wet dip). It has been observed that capacitance and reliability of the MIM structure (e.g., time dependent dielectric breakdown (TDDB)) may be improved with corner rounding and smoothing. The photoresist layer 178 is removed after the trenches 180 and 182 have been formed.

Figure 6:
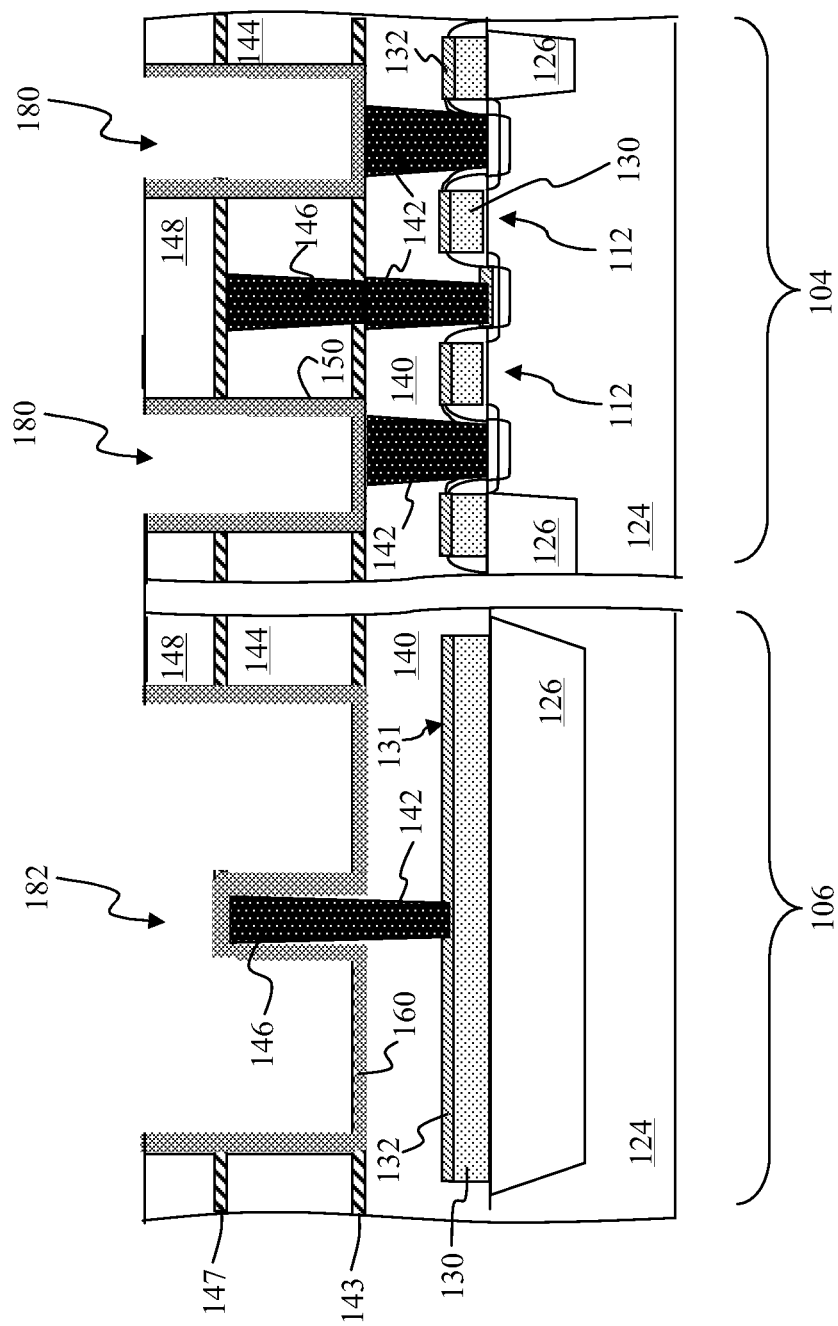

With reference to FIG. 6, the bottom electrode layers for the MIM capacitors 114 and 120 in the regions 104 and 106 are formed. Specifically, a metal layer is deposited to partially fill in the trenches 180 and 182. In trenches 180, the metal layer forms the bottom electrode layers 150 and engages the top faces of the contacts 142, and is thus electrically connected to the doped regions of the transistors 112. In the trench 182, the metal layer forms the bottom electrode layer 160 and engages at least two faces of the contact 146, and is thus electrically connected to the silicide layer 132 on the dummy gate electrode 131. In the current embodiment, the metal is a layer of TiN deposited to a thickness ranging from about 100 to about 500 Å, but in other embodiments may be thicker or thinner. It may be formed by atomic layer deposition (ALD), PVD, CVD, or other suitable technique. Subsequently, the portions of the metal layer outside the trenches 180 and 182 are removed by a suitable process such as chemical mechanical polishing (CMP).

Figure 7:
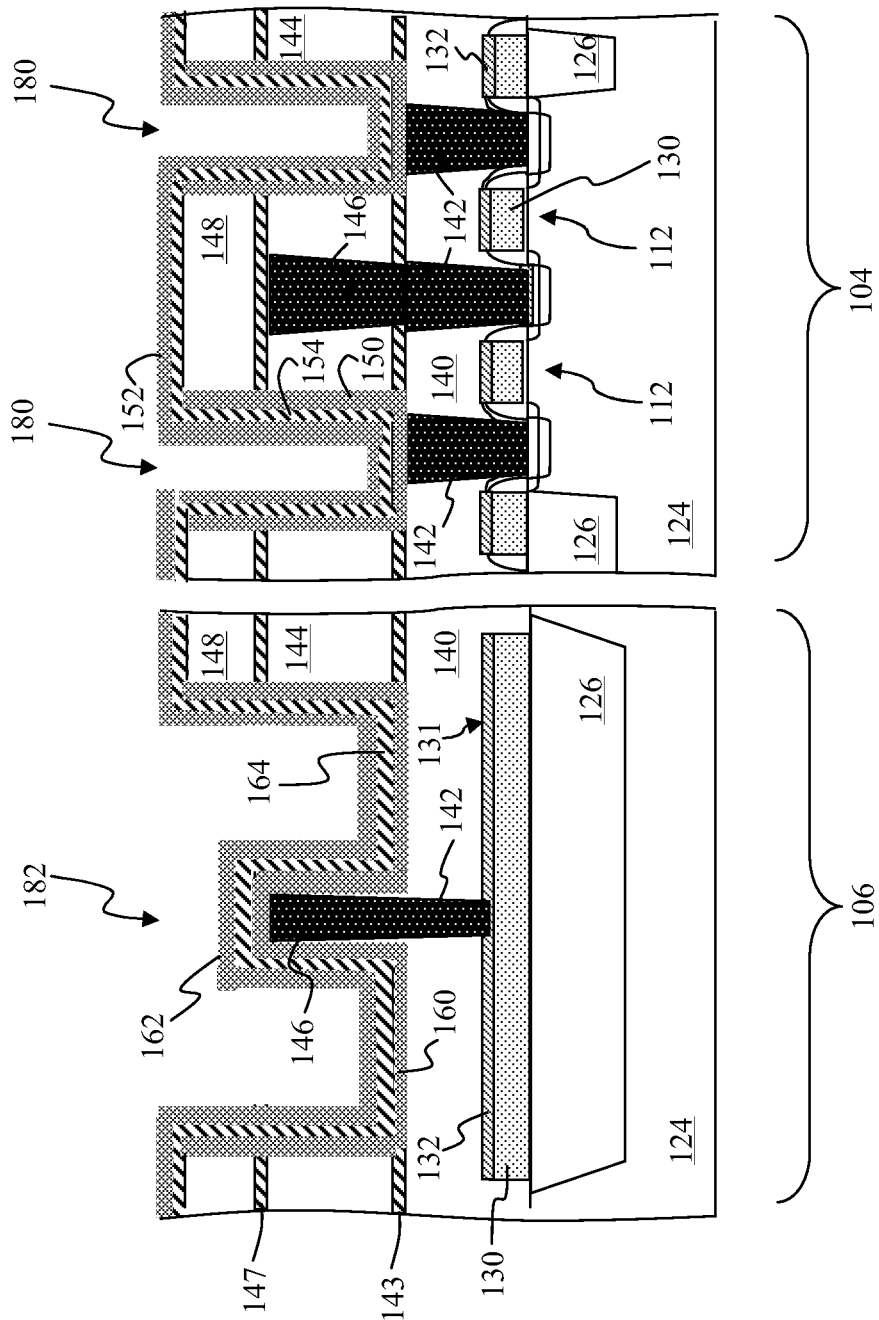

With reference to FIG. 7, the insulator and top electrode layers of the MIM capacitors 114 and 120 in the regions 104 and 106 are next formed. First, a dielectric layer is deposited over the ILD layer 148 and bottom electrodes 150 and 160. In the trenches 180, the dielectric layer forms the insulator 154 and in the trench 182, the dielectric layer forms the insulator 164. In the current embodiment, the dielectric layer is a layer of $ZrO_2$ deposited to a thickness ranging from about 50 to about 400 Å, but in other embodiments may be thicker or thinner. It may be formed by ALD, PVD, CVD, or other suitable technique. Next, a second metal layer is deposited over the dielectric layer. In the trenches 180, the second metal layer forms the top electrodes 152 and in the trench 182, the second metal layer forms the top electrode 162. In the current embodiment, the metal is a layer of TiN deposited to a thickness ranging from about 100 to about 500 Å, but in other embodiments may be thicker or thinner. It may be formed by ALD, PVD, CVD, or other suitable technique.

Figure 8:
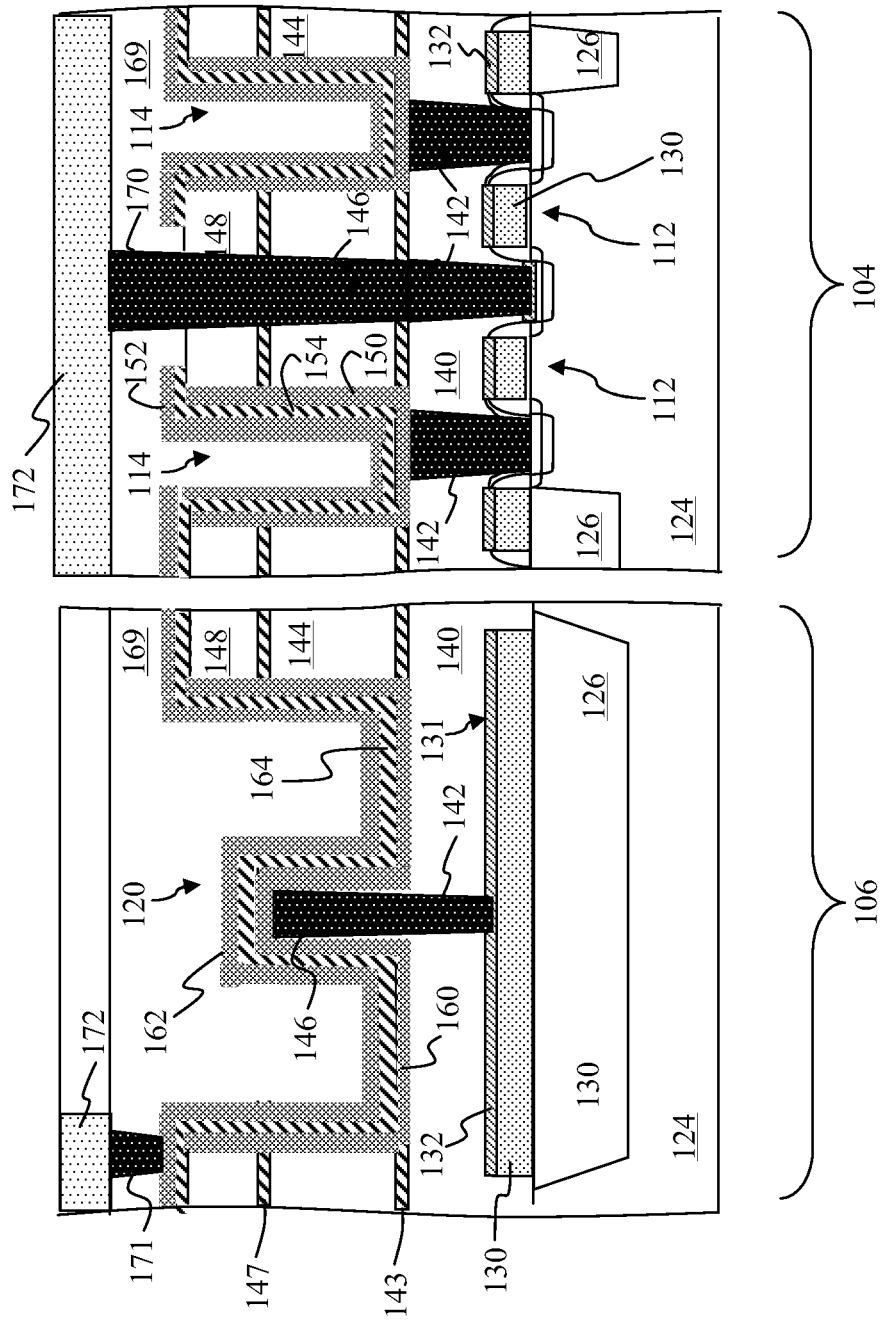

With reference to FIG. 8, the fourth ILD layer 169 is deposited over the MIM capacitors 114 and 120 in the regions 104 and 106. The ILD layer 169 fills in the remainder of the trenches 180 and 182. Next, the contact 170 is formed in the ILD layer 169. In particular, the contact 170 is formed by etching a trench in the ILD layer 169 and removing a portion of the etch stop layer 147, to expose a top portion of the contact 146. The trench is then filled with metal which engages the metal of the contact 142 in the region 104. Next, the contact 171 is formed through the ILD layer 169 and such that it engages the top gate electrode 162 of the MIM capacitor 120. Finally, the metal layer 172 is formed over the ILD layer 169 such that it engages the top face of contact 170 in region 104 and the top face of contact 171 in region 106. As mentioned above, the metal layer 172 is part of the interconnect structure for connecting the devices in region 104 and 106 to each other and to other devices the integrated circuit.

Figure 9:
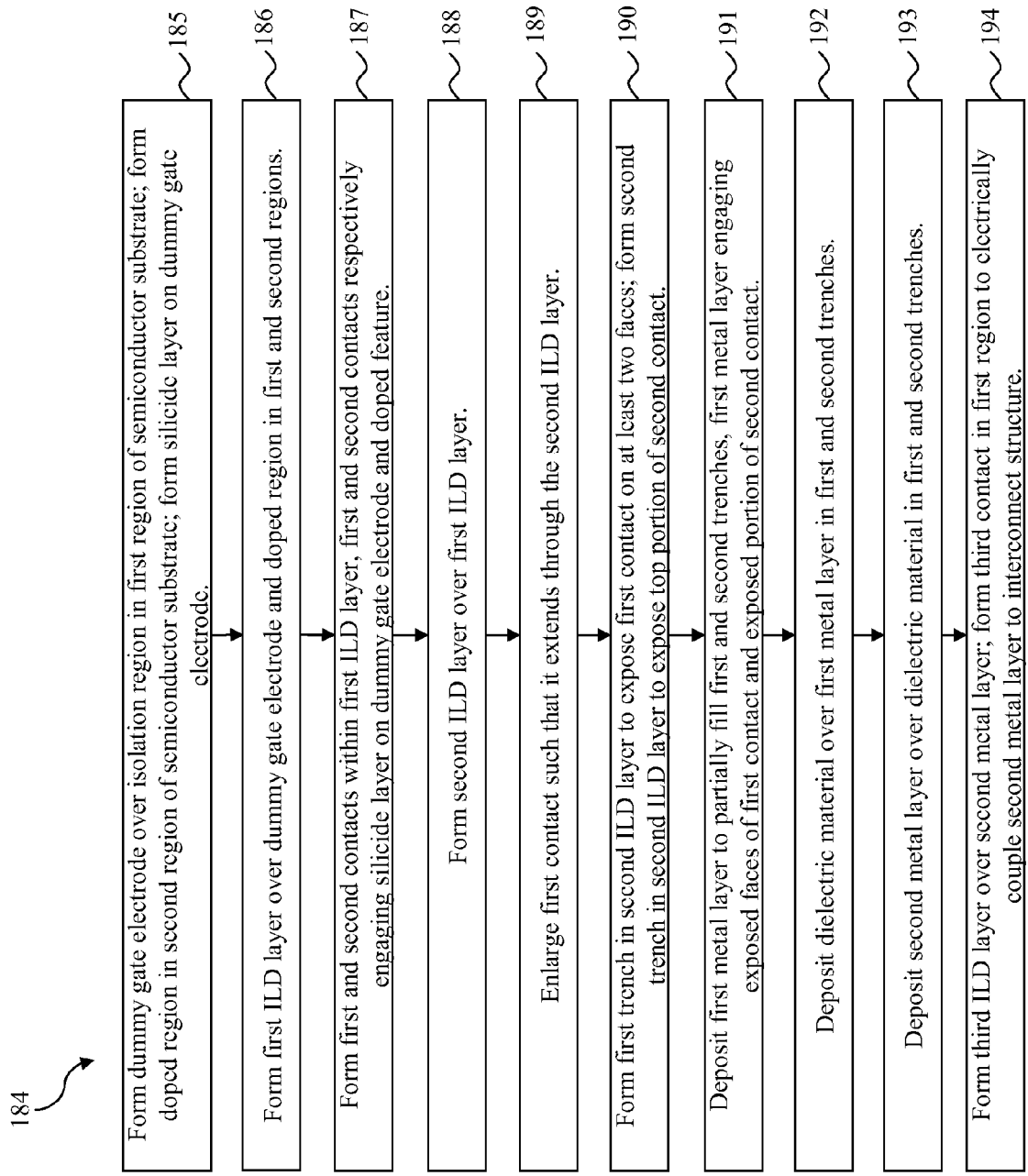
FIG. 9 is a high-level flowchart showing the process that is described in association with FIGS. 2-8.

FIG. 9 is a high-level flowchart showing a process 184 that was described above in association with FIGS. 2-8. Process 184 begins at block 185 where the dummy gate electrode 131 is formed over the isolation region 126 in the region 106 of the semiconductor substrate 124. Also, a doped region is formed in the region 104 of semiconductor substrate 124, and the silicide layer 132 is formed on the dummy gate electrode 131. The process 184 proceeds to block 186 where the first ILD layer 140 is formed over the dummy gate electrode 131 and the doped region in the region 106 and 104, respectively. Then, in block 187, the contacts 142 are formed within the first ILD layer 140 such that the contact 142 in the region 104 engages the doped region and the contact 142 in region 106 engages the suicide layer 132 on the dummy gate electrode 131. Process 184 proceeds to block 188 where the second ILD layer 144 is formed over the first ILD layer 140. Next, in block 189, the contact 142 in the region 106 is enlarged by forming the contact 146 through ILD layer 144 such that it engages contact 142. Also, a third ILD layer 148 is formed over the ILD layer 144. Process 184 proceeds to block 190 where trench 182 is formed in region 106 to expose the contact 146 on at least two faces. Also, trench 114 is formed in region 104 to expose a top portion of contact 142. Then, in block 191, a first metal layer is deposited to partially fill the trenches 114 and 120. The metal layer engages the exposed faces of contact 146 in region 106 and the exposed top portion of contact 142 in region 104. Also, a CMP process is performed to remove any metal deposited outside of the trenches 114 and 120. Process 184 proceeds to block 192 where a dielectric material is deposited over the first metal layer to partially fill the trenches 114 and 120. Next, in block 193, a second metal layer is deposited over the dielectric layer to partially fill the trenches 114 and 120. Finally, process 184 proceeds to block 194 where the ILD layer 169 is formed over the second metal layer to fill in the trenches 114 and 120. Also, the contact 171 is formed through the ILD layer 169 to electrically connect the second metal layer to an interconnect structure.

As noted above, the semiconductor device 100 shown in FIG. 1 contains MIM capacitors in both regions 104 and 106. The stages of manufacture depicted in FIGS. 2-8 illustrate that the MIM capacitors 114 and 120 are formed simultaneously and of the same materials. No extra masking steps or processes are required to form the decoupling capacitor 120 in region 106. In other words, the process to form decoupling capacitor 120 is compatible with the process to form the DRAM capacitors 114 in region 104. Compatible processes reduce complexity and fabrication costs. Unfortunately, reductions in complexity and cost are negated to some extent if maximum capacitance of the MIM capacitors is low. However, by wrapping the bottom electrode 160 of decoupling capacitor 120 around the contact 146, as depicted in FIG. 1, the maximum capacitance of capacitor 120 is increased without sacrificing compatibility with MIM capacitors 114 in the DRAM circuit.

Figure 10:
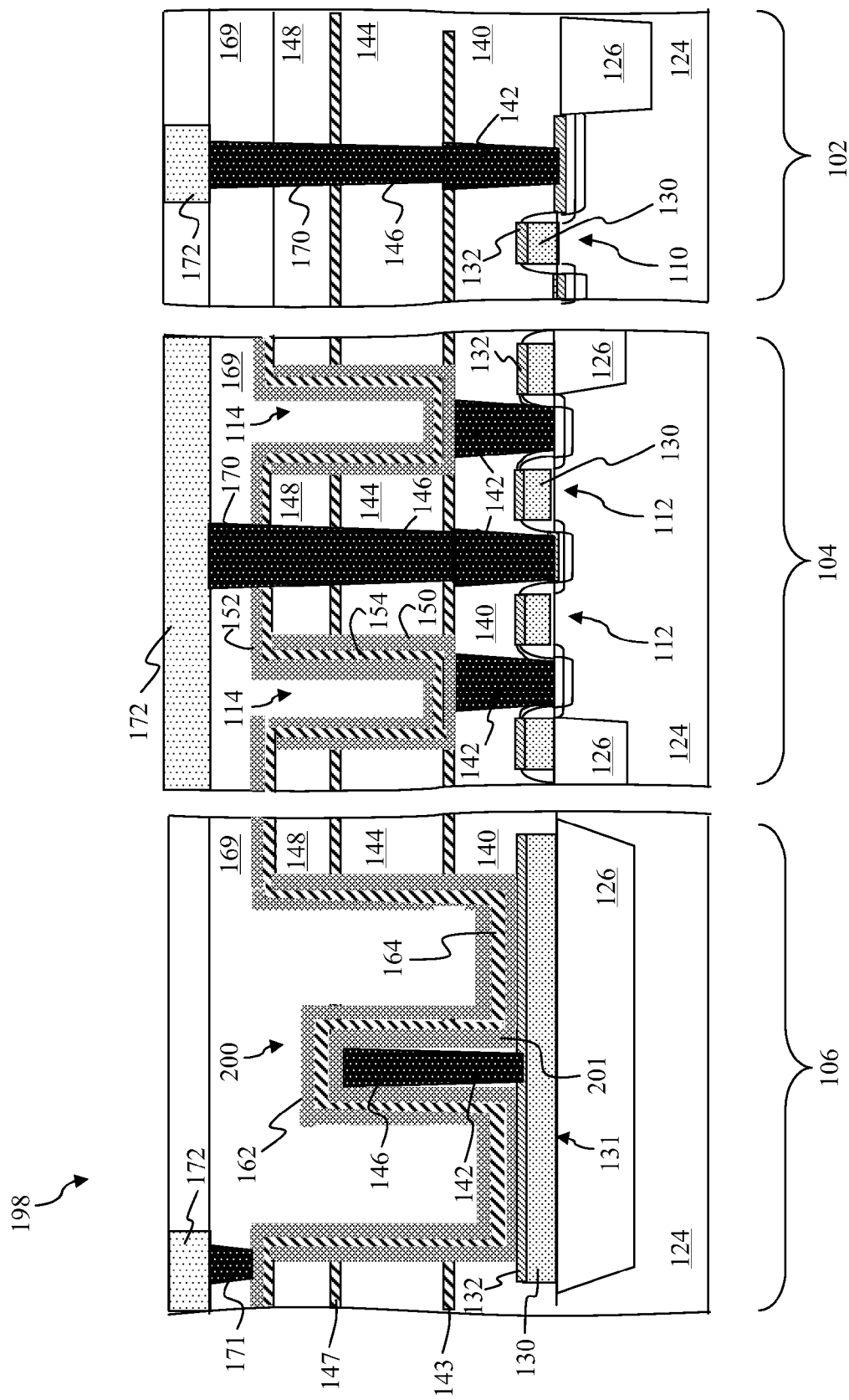
FIG. 10 is a diagrammatic sectional side view of a semiconductor device different from the semiconductor device of FIG. 1.

FIG. 10 is a diagrammatic sectional side view of a semiconductor device 198. The semiconductor device 100 is configured as a system-on-chip (SoC) device that integrates various functions on a single chip. The semiconductor device 198 is similar to the semiconductor device 100 of FIG. 1. Accordingly, similar features in FIG. 10 are numbered the same for the sake of simplicity and clarity. In region 106, the semiconductor device 198 includes a MIM capacitor 200. The MIM capacitor 200 is similar to the MIM capacitor 120 in semiconductor device 100 except that the MIM capacitor 200 extends downwardly through the ILD layer 140 and engages the dummy gate electrode 131. In the current embodiment, the MIM capacitor 200 both wraps around contact pair 142/146 and engages portions of dummy gate electrode 131. Specifically, a bottom electrode 201 engages the silicide layer 132 of the dummy gate electrode 131, at least one face of the contact 142, and at least two faces of the contact 146. As shown in FIG. 10, the bottom electrode 201 substantially surrounds the full length of the contact pair 142/146. As such, the bottom electrode 201 has a has larger surface area than the bottom electrode 160 in FIG. 1, and thus MIM capacitor 200 has a larger maximum capacitance than MIM capacitor 120.

Although only one contact pair 142/146 is depicted in region 106, it is understood that a plurality of similar contacts may electrically couple the dummy gate electrode 131 to the bottom electrode 201 of the MIM capacitor 200. In such a case, the capacitor 200 would similarly wrap around each of the plurality of contacts with the bottom electrode 201 engaging at least two faces of each of the plurality of contacts and also the silicide layer 132. Accordingly, increasing the number of such contact pairs would increase the surface area of the bottom electrode 201, thereby increasing the capacitance of MIM capacitor 200.

Figure 11:
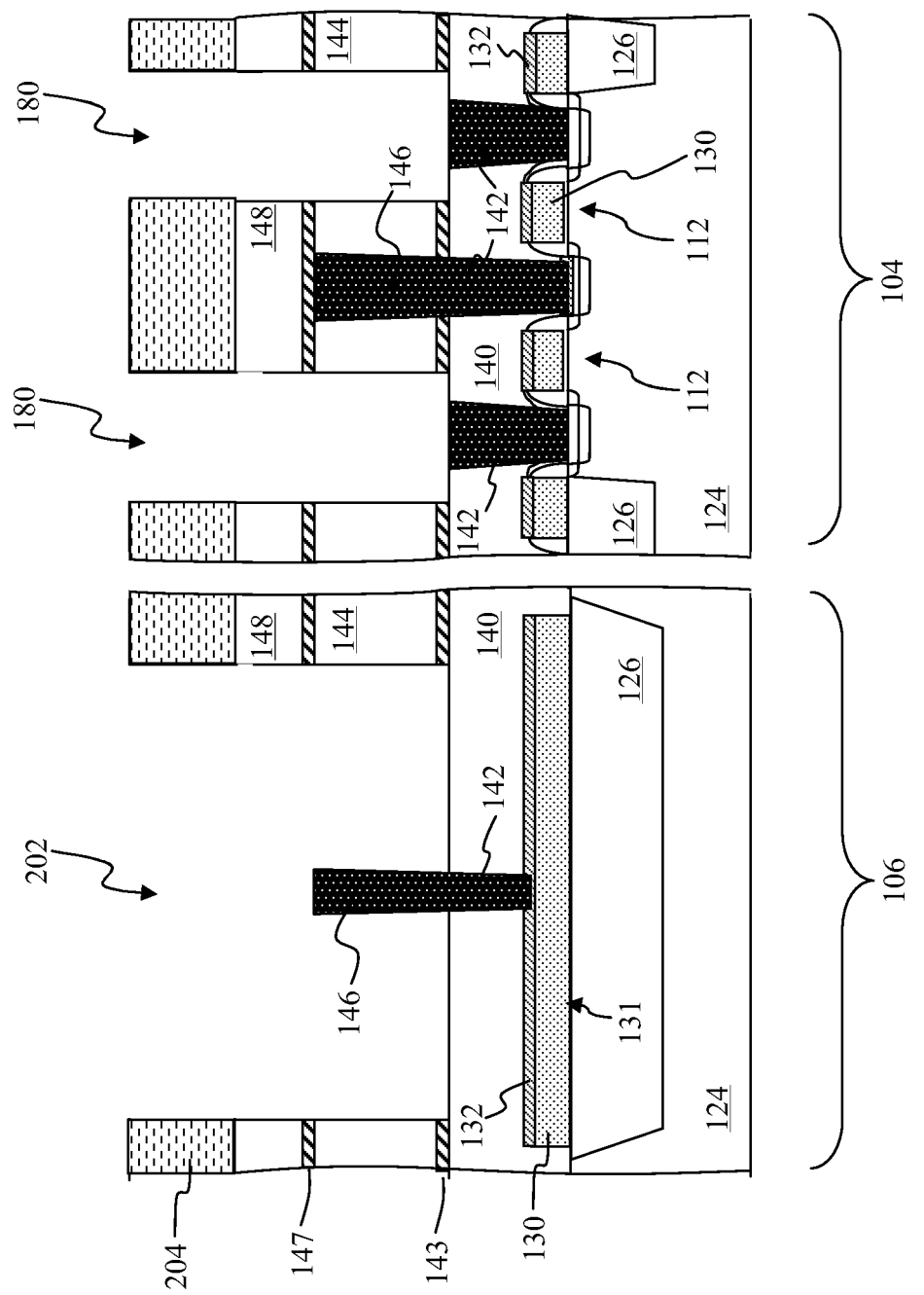
FIGS. 11-13 are diagrammatic sectional side views of a portion of the semiconductor device of FIG. 10 during various successive stages of manufacture.
Figure 12:
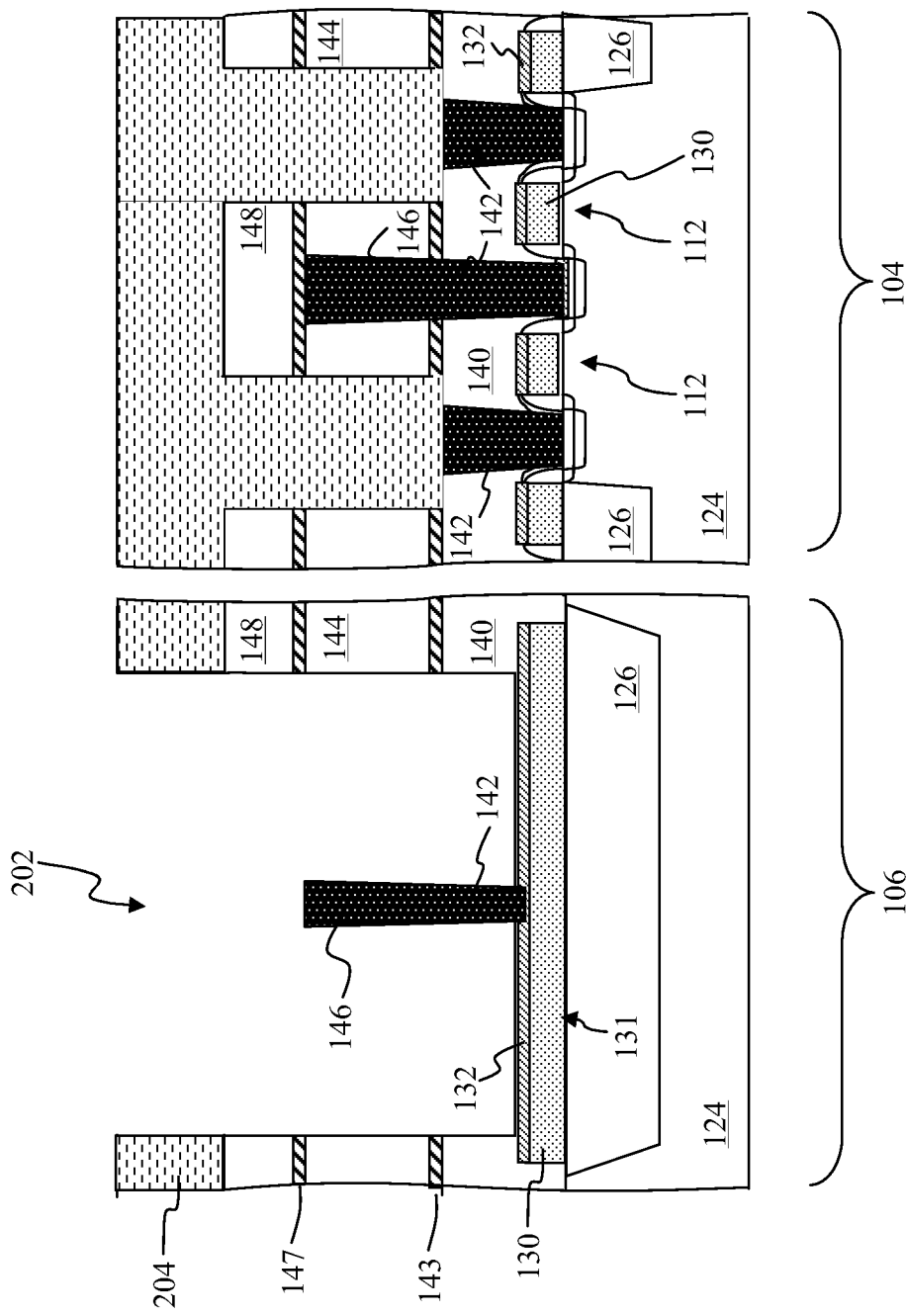
Figure 13:
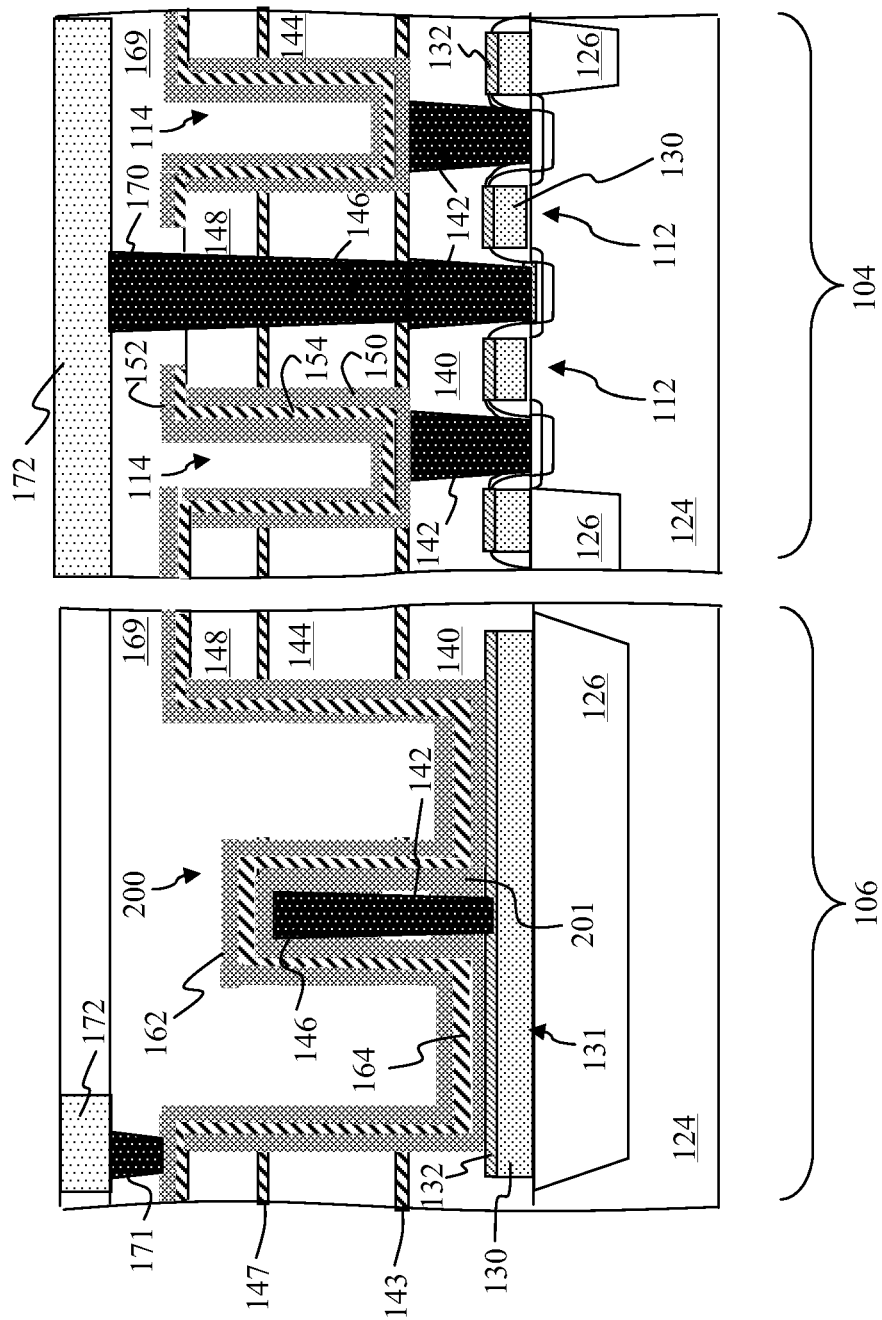

With reference now to FIGS. 11-13, a method to manufacture the semiconductor device 198 of FIG. 10 is described. FIGS. 11-13 are diagrammatic sectional side views of a portion of the semiconductor device 198 during various successive stages of manufacture. The method to manufacture semiconductor 198 is similar to the method to manufacture semiconductor 100, so for the sake of clarity, only a few select stages are depicted.

FIG. 11 depicts a stage of manufacturing wherein a photoresist layer 204 has been deposited and patterned to facilitate the formation of trenches 180 in region 104 and an trench 202 in the region 106. After the formation of trench 202, the contact 146 in region 106 is exposed at least on two faces.

With respect to FIG. 12, the photoresist layer 204 is subsequently augmented with additional photoresist material. Specifically, photoresist material is deposited in the trenches 180 in the region 104. The augmented photoresist layer 204 now provides protection for the transistors 112 in the region 104. Next, an additional etching process is performed to remove a portion of ILD layer 140, thereby increasing the size of trench 202. After the etching process, at least one face of contact 142 is exposed and portions of the silicide layer 132 on the dummy gate electrode 131 are exposed. The etching process includes dry etching, wet etching, and/or other etching methods. The photoresist layer 204 is subsequently removed from the trenches 180 and from over the ILD layer 148.

With respect to FIG. 13, the MIM capacitors 114 and 200 in the regions 104 and 106, respectively, are formed. In particular, a metal layer is deposited over the ILD layer 140 to partially fill in the trenches 180 and 202. In trenches 180, the metal layer forms the bottom electrode layers 150 and engages the top faces of the contacts 142, and is thus electrically connected to the doped regions of the transistors 112. In the trench 202, the metal layer forms the bottom electrode 201 and engages at least two faces of the contact pair 142/146 and also the exposed portions of the silicide layer 132 on the dummy gate electrode 131. In the current embodiment, the metal is a layer of TiN deposited to a thickness ranging from about 100 to about 500 Å, but in other embodiments it may be thicker or thinner. It may be formed by ALD, PVD, CVD, or other suitable technique. Subsequently, the portions of the metal layer outside the trenches 180 and 202 are removed by a suitable process such as CMP. The processes remaining to form semiconductor device 198 are similar to the processes discussed above in association with FIG. 8.

Figure 14:
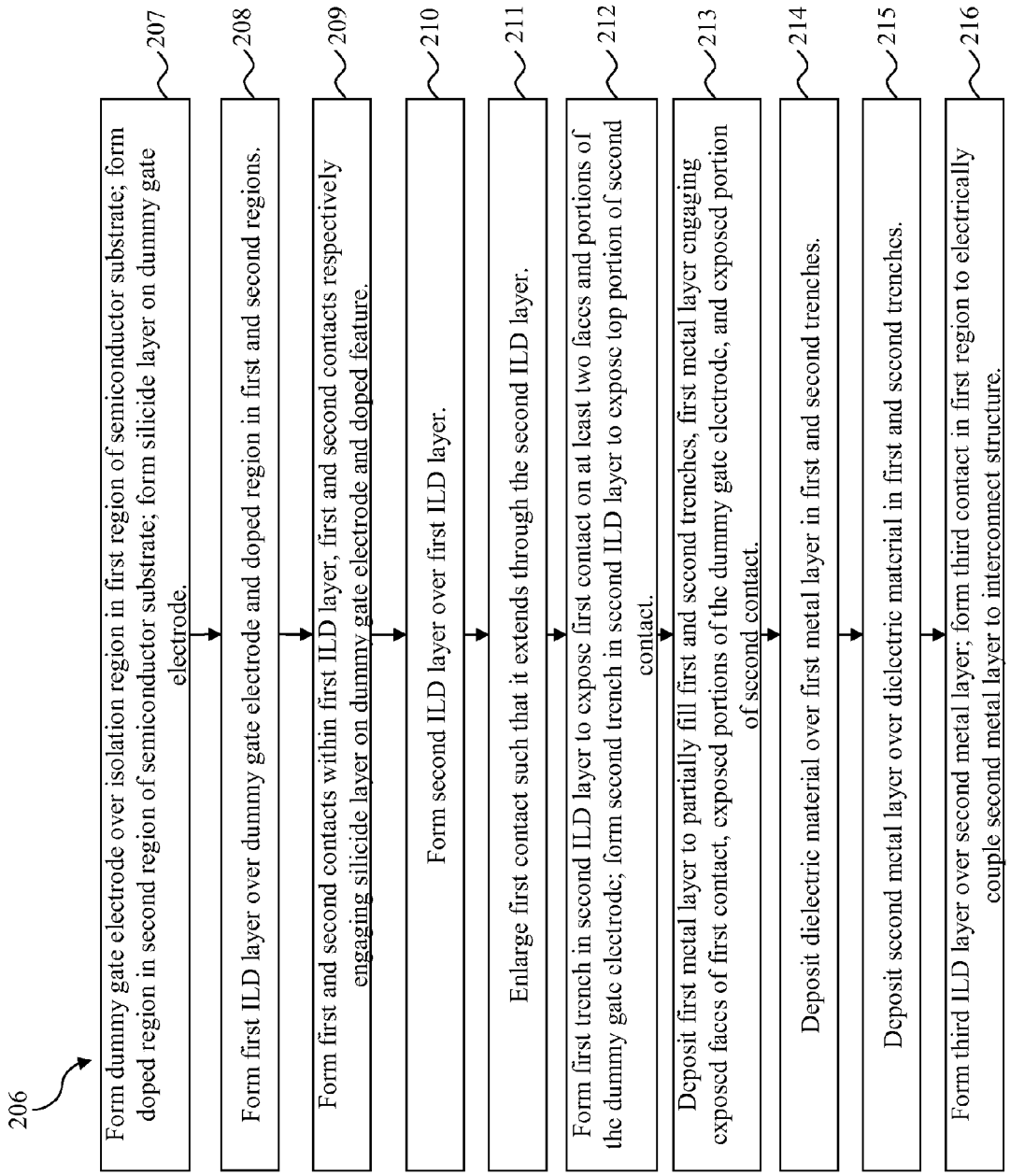
FIG. 14 is a high-level flowchart showing the process that is described in association with FIGS. 11-13.

FIG. 14 is a high-level flowchart showing a process 206 that was partially described above in association with FIGS. 11-13. Process 184 begins at block 207 where the dummy gate electrode 131 is formed over the isolation region 126 in the region 106 of the semiconductor substrate 124. Also, a doped region is formed in the region 104 of semiconductor substrate 124, and the silicide layer 132 is formed on the dummy gate electrode 131. The process 184 proceeds to block 208 where the first ILD layer 140 is formed over the dummy gate electrode 131 and the doped region in the region 106 and 104, respectively. Then, in block 209, the contacts 142 are formed within the first ILD layer 140 such that the contact 142 in the region 104 engages the doped region and the contact 142 in region 106 engages the silicide layer 132 on the dummy gate electrode 131. Process 184 proceeds to block 210 where the second ILD layer 144 is formed over the first ILD layer 140. Next, in block 211, the contact 142 in the region 106 is enlarged by forming the contact 146 through ILD layer 144 such that it engages contact 142. Also, a third ILD layer 148 is formed over the ILD layer 144. Process 184 proceeds to block 212 where trench 202 is formed in region 106 to expose the contact 146 on at least two faces, expose at least one face of contact 142, and expose portions of the silicide layer 132 on the dummy gate electrode 131. Also, trench 114 is formed in region 104 to expose a top portion of contact 142. Then, in block 213, a first metal layer is deposited to partially fill the trenches 114 and 202. The metal layer engages the exposed faces of contact pair 142/146 and silicide layer 132 in region 106 and the exposed top portion of contact 142 in region 104. Also, a CMP process is performed to remove any deposited metal outside of the trenches 114 and 202. Process 184 proceeds to block 214 where a dielectric material is deposited over the first metal layer to partially fill the trenches 114 and 202. Next, in block 215, a second metal layer is deposited over the dielectric layer to partially fill the trenches 114 and 202. Finally, process 184 proceeds to block 216 where the ILD layer 169 is formed over the second metal layer to fill in the trenches 114 and 202. Also, the contact 171 is formed through the ILD layer 169 to electrically connect the second metal layer to the interconnect structure of semiconductor device 100.

The semiconductor devices 100 and 198 are not limited to the aspects and structure of the integrated circuit described above. For example, the dummy gate electrode 131 may be electrically coupled to ground ($V_{SS}$) which would, in turn, electrically couple the bottom electrode 160 or 201 of MIM capacitor 120 or 200 to ground. Also, the contact 171 may be electrically coupled to a power source ($V_{DD}$) which would, in turn, electrically couple the top electrode 162 of MIM capacitor 120 or 200 to the power source. The MIM capacitors 120 and 200 may be in parallel or in series with the DRAM circuit in region 104 and also may be in parallel or in series with the logic circuit in region 102. Further, the integrated circuits in the semiconductor devices 100 and 198 can also include passive components such as resistors, capacitors, inductors, and/or fuses; and active components, such as MOSFETs including p-channel MOSFETs (pMOS transistors) and n-channel MOSFETs (nMOS transistors), complementary metal-oxide-semiconductor transistors (CMOSs), high voltage transistors, and/or high frequency transistors; other suitable components; and/or combinations thereof.

Furthermore, the processes depicted in FIGS. 2-9 and 11-14 are not limited to the aspects described above. For example, the extra masking step required to enlarge the trench 202 down to the dummy gate electrode 131, as depicted in FIG. 12, may be carried out at a different point during circuit fabrication and may utilize different techniques to protect the transistors 112 in the region 104 during etching.

Thus, the present disclosure provides for a semiconductor device. In one embodiment, the semiconductor device includes a semiconductor substrate, an isolation structure disposed in the semiconductor substrate, a conductive layer disposed over the isolation structure, a capacitor disposed over the isolation structure, the capacitor including a top electrode, a bottom electrode, and a dielectric disposed between the top electrode and the bottom electrode, and a first contact electrically coupling the conductive layer and the bottom electrode, the bottom electrode substantially engaging the first contact on at least two faces. The top electrode and the bottom electrode may be composed of metal. The device may include a second contact electrically coupling the conductive layer and the bottom electrode, the bottom electrode substantially engaging the second contact on at least two faces. The device also may include an interlayer dielectric (ILD) layer disposed between the bottom electrode of the capacitor and the conductive layer, the contact extending through the ILD layer. An etch stop layer may be disposed over the ILD layer, the lower-most portion of the bottom electrode being proximate to the etch stop layer. The bottom electrode further may engage the conductive layer. Further, the bottom electrode may substantially surrounds and engages the length of the first contact. The conductive layer may include a silicide layer, the contact engaging the silicide layer. The semiconductor device may also include a embedded memory cell formed on the semiconductor substrate, the memory cell including a further capacitor that is compositionally equivalent to the capacitor.

In another embodiment, a semiconductor device includes a semiconductor substrate including a first region and a second region, an isolation structure formed in the first region, a dummy gate electrode disposed over the isolation structure, a first metal-insulator-metal (MIM) capacitor formed over the isolation structure in the first region, the first MIM capacitor including a first top electrode, a first bottom electrode, and a first dielectric disposed therebetween, a first contact electrically coupling the dummy gate electrode and the first bottom electrode, the first bottom electrode engaging the first contact on at least two faces, and a second MIM capacitor formed over the second region, the second MIM capacitor including a second top electrode, a second bottom electrode, and a second dielectric disposed therebetween, the second MIM capacitor being compositionally equivalent to the first MIM capacitor. The device may include a doped region formed in the second region, and a second contact electrically coupling the doped region and the second bottom electrode. The device also may include a memory cell formed in the second region, the memory cell including the second MIM capacitor and a transistor, the transistor including the doped region and a gate electrode, and the gate electrode being compositionally equivalent to the dummy gate electrode. The dummy gate electrode may include a first silicide layer, the contact engaging the first silicide layer. The device further may include a second silicide layer disposed over the doped region, the second contact engaging the second silicide layer. Also, a second contact electrically may couple the dummy gate electrode and the first bottom electrode, the first bottom electrode engaging the second contact on at least two faces. The semiconductor device may include an interlayer dielectric (ILD) layer disposed between the first bottom electrode of the first capacitor and the dummy gate electrode, the first contact extending through the ILD layer. An etch stop layer may be disposed over the ILD layer, the lower-most portion of the first bottom electrode being proximate to the etch stop layer. Further, the first bottom electrode further may engage the dummy gate electrode. And the first bottom electrode may substantially surround and engage the length of the first contact.

The present disclosure also provides a method of fabricating a semiconductor device that includes a semiconductor substrate including a first region and a second region, the first region including an isolation structure and a dummy gate electrode disposed over the isolation structure, the second region including a doped region and a gate electrode. In one embodiment, the method includes forming a first interlayer dielectric (ILD) layer over the dummy gate electrode in the first region and over the gate electrode and doped region in the second region, forming first and second contacts within the first ILD layer, the first and second contacts respectively engaging the dummy gate electrode and the doped feature, forming a second ILD layer over the first ILD layer, extending the first contact through the second ILD layer, forming a first trench in the second ILD layer to expose the first contact on at least two faces, forming a second trench in the second ILD layer to expose a top portion of the second contact, depositing a first metal layer to partially fill the first and second trenches, the first metal layer engaging the exposed faces of the first contact and the exposed portion of the second contact, depositing a dielectric material over the first metal layer in the first and second trenches, and depositing a second metal layer over the dielectric material in the first and second trenches. The method may include forming an etch stop layer over the first ILD layer after forming the first and second contacts. The forming the first trench and the forming the second trench may include removing a portion of the second ILD layer and a portion of the etch stop layer. The forming the first trench may include depositing a protection layer over the second ILD layer in the second region and removing a portion of the second ILD layer, the etch stop layer, and the first ILD layer to expose a portion of the dummy gate electrode. The depositing the first metal layer may include depositing the metal layer on the exposed portion of the dummy gate electrode, and forming the second trench includes removing a portion of the second ILD layer and a portion of the etch stop layer. The method further may include forming a silicide layer on the dummy gate electrode and doped region, and the forming the first and second contacts includes electrically coupling the first and second contacts respectively to the silicide layer on the dummy gate electrode and doped region. The method may include forming a third contact within the first ILD layer, the third contact engaging the dummy gate electrode, where the forming the first trench may include exposing the third contact on at least two faces, and where the depositing the first metal layer may include depositing the metal layer on the exposed faces of the third contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduce herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate;
an isolation structure disposed in the semiconductor substrate;
a conductive layer disposed over the isolation structure;
a capacitor disposed over the isolation structure, the capacitor including:
a top electrode;
a bottom electrode; and
a dielectric disposed between the top electrode and the bottom electrode; and
a first contact disposed between and electrically coupling the conductive layer and the bottom electrode, the bottom electrode physically contacting the first contact on at least two faces;
wherein the conductive layer includes a silicide layer, the first contact engaging the silicide layer.

2. A semiconductor device according to claim 1, wherein the top electrode and the bottom electrode are composed of metal.

3. A semiconductor device according to claim 1, including a second contact electrically coupling the conductive layer and the bottom electrode, the bottom electrode substantially engaging the second contact on at least two faces.

4. A semiconductor device according to claim 1, including an interlayer dielectric (ILD) layer disposed between the bottom electrode of the capacitor and the conductive layer, the first contact extending through the ILD layer.

5. A semiconductor device according to claim 4, including an etch stop layer disposed over the ILD layer, the lower-most portion of the bottom electrode being proximate to the etch stop layer.

6. A semiconductor device according to claim 1, wherein the bottom electrode further engages the conductive layer.

7. A semiconductor device according to claim 1, wherein the bottom electrode substantially surrounds and engages the length of the first contact.

8. A semiconductor device according to claim 1, including a embedded memory cell formed on the semiconductor substrate, the memory cell including a further capacitor that is compositionally equivalent to the capacitor.

9. A semiconductor device, comprising:
a semiconductor substrate including a first region and a second region;
an isolation structure formed in the first region;
a dummy gate electrode disposed over the isolation structure;
a first metal-insulator-metal (MIM) capacitor formed over the isolation structure in the first region, the first MIM capacitor including a first top electrode, a first bottom electrode, and a first dielectric disposed therebetween;
a first contact electrically coupling the dummy gate electrode and the first bottom electrode, the first bottom electrode engaging the first contact on at least two faces; and
a second MIM capacitor formed over the second region, the second MIM capacitor including a second top electrode, a second bottom electrode, and a second dielectric disposed therebetween, the second MIM capacitor being compositionally equivalent to the first MIM capacitor.

10. A semiconductor device according to claim 9, including a doped region formed in the second region; and a second contact electrically coupling the doped region and the second bottom electrode.

11. A semiconductor device according to claim 10, including a memory cell formed in the second region, the memory cell including the second MIM capacitor and a transistor, the transistor including the doped region and a gate electrode, and the gate electrode being compositionally equivalent to the dummy gate electrode.

12. A semiconductor device according to claim 10,
wherein the dummy gate electrode includes a first silicide layer, the first contact engaging the first silicide layer; and
including a second silicide layer disposed over the doped region, the second contact engaging the second silicide layer.

13. A semiconductor device according to claim 9, including a second contact electrically coupling the dummy gate electrode and the first bottom electrode, the first bottom electrode engaging the second contact on at least two faces.

14. A semiconductor device according to claim 9, including an interlayer dielectric (ILD) layer disposed between the first bottom electrode of the first capacitor and the dummy gate electrode, the first contact extending through the ILD layer.

15. A semiconductor device according to claim 14, including an etch stop layer disposed over the ILD layer, the lower-most portion of the first bottom electrode being proximate to the etch stop layer.

16. A semiconductor device according to claim 9, wherein the first bottom electrode further engages the dummy gate electrode.

17. A semiconductor device according to claim 9, wherein the first bottom electrode substantially surrounds and engages the length of the first contact.

18. A method of fabricating a semiconductor device that includes a semiconductor substrate including a first region and a second region, the first region including an isolation structure and a dummy gate electrode disposed over the isolation structure, the second region including a doped region and a gate electrode, the method comprising:
forming a silicide layer on the dummy gate electrode and doped region;
forming a first interlayer dielectric (ILD) layer over the dummy gate electrode in the first region and over the gate electrode and doped region in the second region;
forming first and second contacts within the first ILD layer, the first and second contacts respectively engaging the silicide layer on the dummy gate electrode and the doped region;
forming an etch stop layer over the first ILD layer;
forming a second ILD layer over the first ILD layer;
extending the first contact through the second ILD layer;
forming a first trench in the second ILD layer to expose the first contact on at least two faces, wherein the forming the first trench includes removing a portion of the second ILD layer and a portion of the etch stop layer;
forming a second trench in the second ILD layer to expose a top portion of the second contact, wherein forming the second trench includes removing a portion of the second ILD layer and a portion of the etch stop layer;
depositing a first metal layer to partially fill the first and second trenches, the first metal layer engaging the exposed faces of the first contact and the exposed portion of the second contact;
depositing a dielectric material over the first metal layer in the first and second trenches; and
depositing a second metal layer over the dielectric material in the first and second trenches.

19. A method according to claim 18,
wherein the forming the first trench includes depositing a protection layer over the second ILD layer in the second region and removing a portion of the second ILD layer, the etch stop layer, and the first ILD layer to expose a portion of the dummy gate electrode; and
wherein the depositing the first metal layer includes depositing the metal layer on the exposed portion of the dummy gate electrode.

* * * * *